(12) United States Patent
Stephelbauer et al.

(10) Patent No.: US 7,106,606 B2
(45) Date of Patent: Sep. 12, 2006

(54) VOLTAGE-CURRENT CONVERTER WITH ADJUSTABLE QUIESCENT CURRENT

(75) Inventors: Carl Stephelbauer, Ennsdorf (AT); Günter Haider, Linz (AT)

(73) Assignee: Infineon Technologies AG, Munich (DE)

( * ) Notice: Subject to any disclaimer, the term of this patent is extended or adjusted under 35 U.S.C. 154(b) by 183 days.

(21) Appl. No.: 10/826,670

(22) Filed: Apr. 16, 2004

(65) Prior Publication Data

US 2005/0030773 A1 Feb. 10, 2005

(30) Foreign Application Priority Data

Apr. 17, 2003 (DE) .................. 103 17 968

(51) Int. Cl.
*H02M 7/00* (2006.01)
(52) U.S. Cl. ........................................ 363/73
(58) Field of Classification Search ................. 363/73; 323/312, 315, 316, 317
See application file for complete search history.

(56) References Cited

U.S. PATENT DOCUMENTS

| 5,216,354 | A | * | 6/1993 | DeGuelle | 323/312 |
| 5,266,887 | A | * | 11/1993 | Smith | 323/316 |
| 5,463,308 | A | * | 10/1995 | Vorenkamp et al. | 323/312 |
| 5,519,309 | A | * | 5/1996 | Smith | 323/316 |
| 5,525,897 | A | * | 6/1996 | Smith | 323/315 |
| 6,121,818 | A | * | 9/2000 | Kim et al. | 327/359 |
| 2004/0165719 | A1 | * | 8/2004 | Gregorius | 379/377 |

FOREIGN PATENT DOCUMENTS

EP 1 075 081 A2 2/2001

OTHER PUBLICATIONS

"Halbleiter-Schaltungstechnik", Ulrich Tietze and Christoph Schenk, Springer, ISBN 3-540-42849-6, 2002, pp. 795-804.
"High-Performance Quadrature Modulators for Broadband Wireless Communication", Benjamin Sam and Phillip Halford, IEEE, 2001, 4 pgs.
"A 20-mA-Receive, 55-mA-Transmit, Single-Chip GSM Transceiver in 0.25-μm CMOS", Paolo Orsatti, Francesco Piazza and Qiuting Huang, IEEE Journal of Solid-State Circuits, vol. 34, No. 12, Dec. 1999, pp. 1869-1880.

* cited by examiner

*Primary Examiner*—Adolf Berhane
(74) *Attorney, Agent, or Firm*—Eschweiler & Associates, LLC

(57) ABSTRACT

Method for controlling an output signal (A) of a voltage-current converting device, to which a reference voltage ($U_{REF}$) is fed and in which a voltage signal (I, IX) applied on the input side is converted into a current signal, a reference voltage ($U_{REF}$) setting the output quiescent current ($I_O$). The provision of a setting device, which is connected to the reference input and is used to determine an envelope of an amplitude-modulated signal at the input is furthermore expedient.

19 Claims, 2 Drawing Sheets

VOLTAGE-CURRENT CONVERTER WITH ADJUSTABLE QUIESCENT CURRENT

The invention relates to a method and an arrangement for controlling an output signal of a voltage-current converting device, in which a voltage signal applied on the input side is converted into a current signal.

An important measure of the quality of communication systems is the adjacent channel power for the so-called adjacent channel leakage ratio (ACLR). The latter specifies, given a fixed total power, the ratio between an emitted power in a useful channel and in an adjacent channel. The main cause of the inherently undesirable power in the adjacent channel is non-linearities in the active components, such as amplifier stages, for example. Under specific conditions, these generate distortions or intermodulations, which leads to a rise in the adjacent channel power. This particularly affects modern communication systems, such as WCDMA, for example, which generate a noise-like signal on account of the type of modulation that they use.

Noise-like signals generally have a high crest factor, i.e. the difference between the averaged power value of such a noise-like signal and the highest power value occurring in the signal is very large. For active components, in particular amplifier stages, it is therefore necessary that the high voltage peaks that occur can furthermore be processed linearly. Otherwise, a non-linear processing leads to compression and to intermodulation products, which increases the power in the adjacent channel. Since intermodulation products or a poor ACLR value can be compensated for only in a very complicated manner, it is necessary to comply with the necessary linearity requirements made of the active components in the entire signal chain.

FIG. 3 shows a voltage-current converter which is part of a mixer which is used to modulate a signal onto a carrier frequency. The corresponding construction of such an overall system can be gathered for example from the document "Benjamin Sam, Phillip Halford, High-Performance Quadrature Modulators for Broadband Wireless Communication, IEEE 2001".

The voltage-current converter described therein has two inputs I and IX, at which the positive and negative half-cycles of a component of the baseband signal are respectively present. The outputs of the operational amplifiers OP are connected to the base of the respective transistors. Consequently, the signal present at the operational amplifier controls the collector current at the collector output A with the aid of the current mirrors $I_0$.

In order to be able to transmit high signal levels with good linearity, the bias current $I_0$ has to be chosen such that it corresponds at least to the peak value of the signal current which is generated in the event of a maximum input signal. If the input signal has a high crest factor, as occurs in the case of W-CDMA signals, a high bias current results in the class A operation that is usually used.

This procedure is at odds with the requirement for a current consumption that is as low as possible, which constitutes a prerequisite for use in mobile devices with only a small energy store.

Therefore, it is an object of the present invention to provide a method and also an arrangement in a voltage-current converter which enables a sufficient linearity in conjunction with a low current consumption.

This object is achieved by means of features of the coordinate patent claims.

They provide a method and an arrangement for controlling an output signal of a voltage-current converting device, to which a reference voltage is fed and with which a voltage signal applied on the input side is converted into a current signal. A reference voltage is provided, which sets the output quiescent current. As a result, the output quiescent current can be reduced, if appropriate, without significantly impairing the linearity of the entire circuit.

A voltage-current converting device has a voltage input and a current output and also a reference input, a voltage at the reference input setting a quiescent current at the current output and the voltage at the reference input being variable. It is advantageous to provide a setting device, which is connected to the reference input of the voltage-current converting device and can be used to determine an envelope of an amplitude-modulated input signal.

The subclaims relate to further advantageous refinements of the invention.

In a further development of the method, the reference voltage follows a voltage value of an envelope curve of the voltage signal applied on the input side. Consequently, the quiescent current is reduced on average over time, while the voltage-current converting device is furthermore in an A operating mode.

In a second refinement of the invention, the reference voltage is set such that the voltage-current converting device undergoes transition to a B operating mode or to an AB operating mode as a result of reduction of the reference voltage.

It is furthermore expedient to design the setting device as a level detector. It is likewise advantageous for the voltage-current converting device to be of differential design.

The invention is explained in detail below using exemplary embodiments with reference to the drawings, in which.

Figure 1:
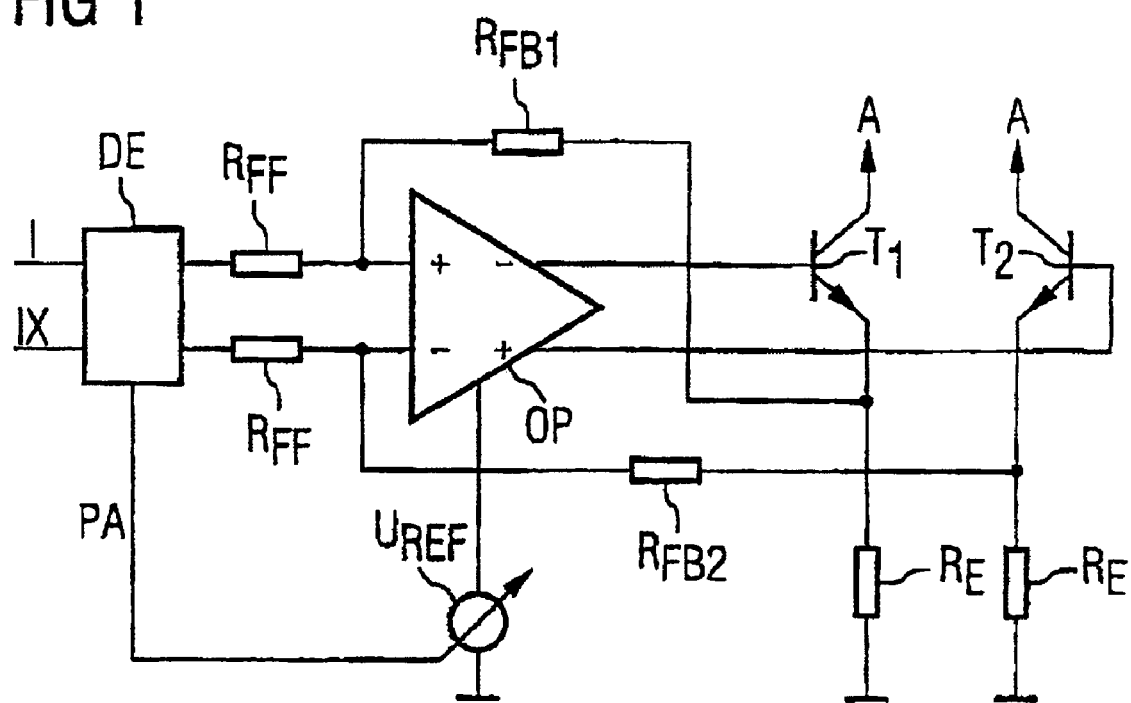
FIG. 1 shows a first exemplary embodiment of the invention.
Figure 3:
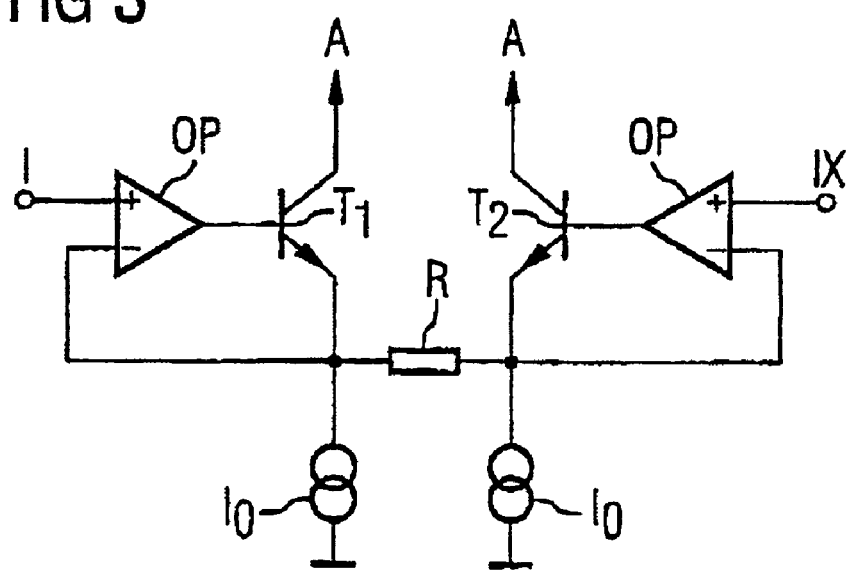
FIG. 3 shows a known embodiment of a voltage-current converter.

FIG. 1 shows a differential embodiment of a voltage-current converter which is part of a modulation device (not shown here). The voltage-current converting device has an operational amplifier OP, the inverting output of which is connected to the base of a transistor T1 and the non-inverting output of which is connected to the base of a transistor T2. The emitter outputs of the transistors T1 and T2 are connected to ground via a resistor $R_E$. The resistors $R_E$ are part of a current source. The collector outputs A of the transistors T1 and T2 lead to a mixer (not shown here), which converts the output signal of the transistors T1 and T2 to a different frequency.

The emitter output of the transistor T1 is connected to the non-inverting input (+) of the operational amplifier OP via a resistor $R_{FB}$. The emitter of the transistor T2 is equally connected to the inverting input (−) of the operational amplifier. The two inputs of the operational amplifier are in each case connected to a resistor $R_{FF}$ and these are connected to the outputs of a detection device DE. The signal I and the inverted signal IX are respectively present at the inputs of the detection device DE.

The operational amplifier OP furthermore has an input for a reference voltage, which is connected to an adjustable voltage source $U_{REF}$. For its part, the voltage source $U_{REF}$ is connected to the detection device DE by a line PA for setting the voltage. As a result, they form a setting device for setting the reference voltage depending on the signal amplitude of the input signal.

During normal operation, a voltage is set at the voltage source $U_{REF}$ such that the base of the two transistors is biased with a voltage such that a constant bias current or a quiescent current $I_0$ is established via the resistors $R_E$. By virtue of this quiescent current, the transistors operate in the linear range.

In the normal operating mode without the detection device DE, a signal applied to the input I generates a voltage change at the non-inverting output "+" of the operational amplifier OP. If the signal at the input I rises with respect to IX, then the base voltage at T2 rises and the base voltage at T1 falls by the same magnitude. As a result, the current flowing through T2 rises, while the current flowing through T1 falls. In this case, the sum of the two currents furthermore remains equal to the sum of the quiescent currents $I_0$ through the two transistors, disregarding the base currents. If, in the next half-cycle, the input IX is active and greater than I, the current flowing through the transistors changes in the other direction on account of the voltage change at the base of the transistors T1 and T2.

This current change is directly proportional to the amplitude of the signal applied to the input I and IX, respectively. Consequently, an input voltage is linearly converted to an output current. The ratio of the voltage dropped across the resistors $R_E$ of the two transistors is set by the resistors $R_{FB}$ and $R_{FF}$. As a result, depending on the ratio of $R_{FB}$ to $R_{FF}$, the voltage difference between I and IX becomes a multiple of the voltage difference between the emitter voltages T1 and T2 and thus of the emitter currents.

If the detection device DE is active, this determines the envelope curve value of an applied signal at I and IX respectively. This envelope curve value is a measure of the maximum amplitude of the voltage at the input I and IX, respectively, at this point in time. The value determined is forwarded via the connection PA.

Therefore, the reference voltage $U_{REF}$ can be reduced, with the result that the quiescent current $I_0$ flowing through the transistors T1 and T2 is also reduced. The quiescent current is nevertheless still greater than the instantaneously applied input signal, so that the linearity between input voltage and output current is maintained in the presence of the input signal I and IX, respectively. In the next half-cycle, the input signal is measured anew and the reference voltage is changed correspondingly. This operating mode of the arrangement is referred to as the A operating mode.

By way of example, let the voltage gain of the operational amplifier circuit be equal to 1 and the voltage difference between the inputs I and IX be 2 mV. The arrangement is in an A operating mode if the quiescent current $I_0$ through the two transistors T1 and T2 corresponds to a voltage at the emitters of T1 and T2 of 6 mV, for example. In such a case, once such an input signal is present at the operational amplifier circuit OP, a current corresponding to a voltage of 7 mV and 5 mV, respectively, flows through the transistors.

The two transistors T1 and T2 are furthermore current-carrying and thus in the A operating mode.

Since the average voltage of the input signal is lower than the maximum occurring input voltage by the crest factor, in this method the average bias current will also turn out to be significantly lower than the bias current required in conventional operation, which corresponds at least to the current prescribed by the maximum voltage value. Consequently, the current consumption is significantly reduced. By way of example, if the crest factor is 6 dB, i.e. the maximum power is 6 dB greater than the average power, then the average quiescent current is lower than the maximum quiescent current by a factor of 2.

The detection device DE is formed as a single level detector. This level detector determines the amplitude at the instant of the input signal. Consequently, the reference voltage $U_{REF}$ follows the envelope curve of the input signal.

Figure 2:
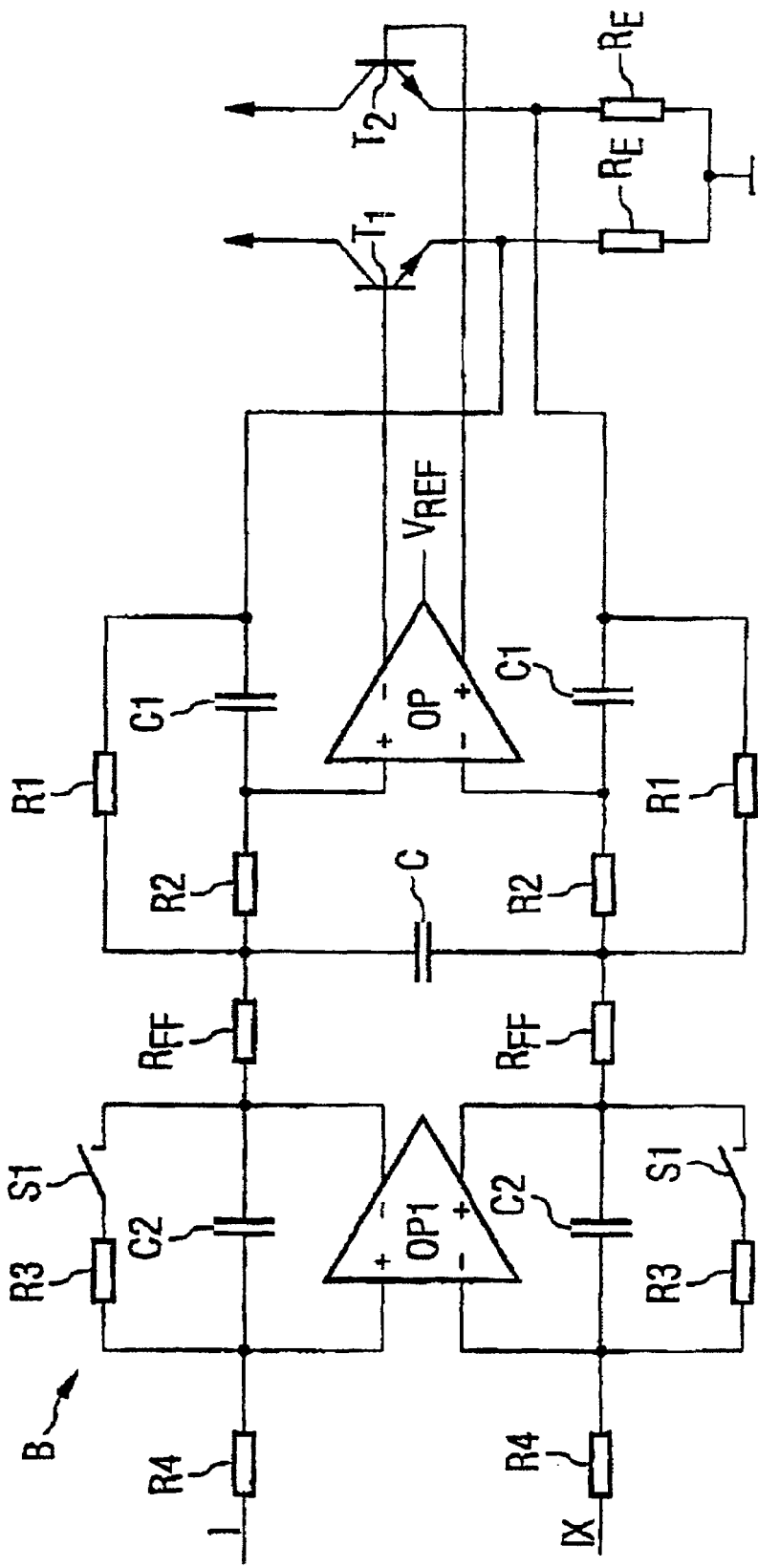
FIG. 2 shows a second exemplary embodiment.

FIG. 2 shows a second configuration of the invention. In this case, identical components bear identical reference symbols, a renewed explanation being dispensed with. In this case, the emitters of the transistors T1 and T2 are connected to the resistors R1 and the capacitors C1. The capacitors are in turn connected to the resistors R2 and the inputs of the operational amplifier OP. The other end of the resistors R2 is connected to the resistor $R_{FF}$ and the resistor R1. Furthermore, the resistors R2 are connected to one another via a capacitance C. In addition, the voltage-current converter has a buffer circuit B, which, for its part, contains an operational amplifier OP1. One input of the operational amplifier OP1 is connected to the respective complementary output via a capacitor C2 and—in parallel therewith—a resistor R3 with a downstream switch S1. In order to achieve a voltage control of the buffer amplifier, resistors R4 are connected into both signal paths upstream of the operational amplifier OP1.

The resistors R1, R2 and the capacitors C1 and C2 form a second-order low-pass filter in order to reduce the noise of all the resistors and the operational amplifiers. In addition, they form a "reconstruction filter" for the digital-to-analog converter (not shown here) which converts the digital input signals I and IX into analog signals. The resultant repetition spectra are likewise suppressed by the reconstruction filter. Since the resistors R1, R2 and $R_{FF}$ generally have a low resistance, it is necessary to provide the high-resistance buffer circuit B in order that the digital-to-analog converter can generate a correct signal.

In this circuit, the reference voltage $U_{REF}$ is reduced until the transistors T1 and T2, respectively, turn off. As a result, the reference quiescent current $I_0$ through the transistors vanishes if no signal is present at the input I or IX. The downstream circuit block (not shown here) applied to the output of the transistors thus consumes no additional current.

If a positive signal is applied to the input I, then the signal paths through the first operational amplifier OP1 of the buffer device B are interchanged. The signal I passes to the inverting "−" input of the operational amplifier OP, and the signal IX passes to the non-inverting input, "+". In order to compensate for the voltage difference between I and IX, the operational amplifier OP increases the base voltage at the transistor T1 and decreases it at T2. As a result, a current flows through the transistor T1. Said current increases until the resultant voltage difference between the emitters of T1 and T2 has compensated for the voltage difference between I and IX. In this case, the transistor T2 furthermore turns off. Since a reduction of the base voltage at T2 cannot lead further to a current reduction via T2, the operational amplifier must have a sufficiently large voltage range in order to compensate for the voltage differences occurring in the input signal.

If a positive signal is present at the input IX, then the transistor T2 switches, while the base of the transistor T1 furthermore remains in the off state. Relative to a clock period of the input signal, which is composed of the signal duration of I and IX, this means that a transistor is turned on in each case only for a half a clock period, that is to say only during the duration of the signal I or IX. This operating mode is referred to as the B operating mode.

In the example mentioned for the A operating mode, in the case of a vanishing quiescent current $I_0$ in the B operating mode, the operational amplifier must be able to regulate a voltage range of at least 2 mV for both outputs in order to correctly map the input voltage difference of 2 mV.

In the case of npn bipolar transistors, a positive base-emitter voltage of approximately 0.7 V is necessary in order to bring the transistor into on-state operation. If the reference voltage is set to be less than the maximum occurring input amplitude but still greater than 0.7 V, this corresponds to an AB operating mode. The small quiescent current which flows through the transistors even when there is no input signal makes it possible, when a signal is present, for a transistor to be in the on state for longer than half a clock period but less than a whole period.

By way of example, the quiescent current $I_0$ may correspond to a voltage drop across $R_E$ of 1 mV. Given a voltage difference between the inputs of 2 mV, the arrangement operates in the boundary region between A and AB operating modes. A pure AB operating mode is present with a quiescent current $I_0$ which corresponds to a quiescent voltage drop across $R_E$ of 0.5 mV and the input difference is furthermore 2 mV.

The invention is based on the idea of reducing the quiescent current of a voltage-current converter in a targeted manner by altering the reference voltage without the linear transfer function being distorted in the process. In this case, the method presented here in the A or B operating mode is not restricted to differential voltage-current converters. It is thus conceivable to use a non-differential input signal.

The invention claimed is:

1. A method for controlling an output signal (A) of a voltage-current converting device, to which a reference voltage is fed and in which a differential voltage signal applied on the input side is converted into a differential current signal, wherein
    a reference voltage is set for the purpose of setting an output quiescent current (I0);
    an envelope of the signal applied on the input side is determined;
    the reference voltage is altered in a manner dependent on the envelope;
    the differential voltage signal is amplified by a factor;
    the amplified differential voltage signal is converted into a current signal.

2. The method as claimed in claim 1 wherein the reference voltage (UREF) follows a voltage value of an envelope of the voltage signal applied on the input side, so that the voltage-current converting device is in an A operating mode.

3. The method as claimed in claim 1 wherein the reference voltage (UREF) is set such that the voltage-current converting device is in a B operating mode or in an AB operating mode.

4. A voltage-current converting device, comprising:
    a voltage input having a first terminal (I) and a second terminal (IX);
    a current output (A) having a first and a second terminal;
    a first transistor (T1) connected to the first terminal of the current output, and a second transistor (t2) connected to the second terminal of the current output;
    an operational amplifier having a first input (+), which is coupled to the first terminal (I), having a second input (−), which is coupled to the second terminal (IX), having a first output (+), which is coupled to a base of the second transistor (T2), and having a second output (−), which is coupled to a base of the first transistor (T1), the operational amplifier (OP) having a reference input and it being possible to set a quiescent current at the current output (A) by means of a voltage at the reference input; and
featuring a setting device (DE), which is coupled to the reference input for feeding in a regulating voltage dependent on an envelope and determining the envelope of an amplitude-modulated signal at the input (I,IX).

5. The voltage-current converter device as claimed in claim 4, wherein the device has a level detector.

6. The voltage-current converting device of claim 4, wherein a regulatable voltage source is provided, the output of which is connected to the reference input of the operational amplifier (OP) and which comprises a regulating input connected to the setting device (DE).

7. The voltage-current converting device of claim 5, wherein a regulatable voltage source is provided, the output of which is connected to the reference input of the operational amplifier (OP) and which comprises a regulating input connected to the setting device (DE).

8. The voltage-current converting device of claim 4, wherein the transistor (T1,T2) of the voltage-current converting device can be operated in an A, B or AB operating mode by means of the quiescent current (I0) that can be set by the operational amplifier (OP).

9. The voltage-current converting device of claim 5, wherein the transistors (T1,T2) of the voltage-current converting device can be operated in an A, B or AB operating mode by means of the quiescent current (I0) that can be set by the operational amplifier (OP).

10. The voltage-current converting device of claim 6, wherein the transistors (T1,T2) of the voltage-current converting device can be operated in an A, B or AB operating mode by means of the quiescent current (I0) that can be set by the operational amplifier (OP).

11. The voltage-current converting device of claim 7, wherein the transistors (T1,T2) of the voltage-current converting device can be operated in an A, B or AB operating mode by means of the quiescent current (I0) that can be set by the operational amplifier (OP).

12. The voltage-current converting device of claim 4, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

13. The voltage-current converting device of claim 5, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

14. The voltage-current converting device of claim 6, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

15. The voltage-current converting device of claim 7, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

16. The voltage-current converting device of claim 8 wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

17. The voltage-current converting device of claim 9, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

18. The voltage-current converting device of claim 10, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

19. The voltage-current converting device of claim 11, wherein a first load (RFB1) is connected between the first input of the operational amplifier (OP) and the emitter of the first transistor (T1) and a first load (RFB2) is connected between the second input of the operational amplifier (OP) and the emitter of the second transistor (T2).

* * * * *